United States Patent [19]
Park et al.

[11] Patent Number: 5,153,459
[45] Date of Patent: * Oct. 6, 1992

[54] DATA TRANSMISSION CIRCUIT FOR DATA BUSES INCLUDING FEEDBACK CIRCUITRY

[75] Inventors: Yong E. Park; Soo I. Cho, both of Seoul; Dong S. Jun, Daigu; Seung M. Seo, Seoul, all of Rep. of Korea

[73] Assignee: Samsung Electronics Co., Ltd., Suwon, Rep. of Korea

[*] Notice: The portion of the term of this patent subsequent to Jul. 12, 2005 has been disclaimed.

[21] Appl. No.: 206,824

[22] Filed: Jun. 15, 1988

[30] Foreign Application Priority Data

Jun. 20, 1987 [KR] Rep. of Korea ............... 1987-6287

[51] Int. Cl.$^5$ ............... H03K 19/096; H03K 17/06; H03K 17/687; G11C 7/00
[52] U.S. Cl. ............... 307/452; 307/242; 307/582; 307/443; 365/190; 365/189.05; 365/203
[58] Field of Search ............... 365/190, 189, 205, 207, 365/208, 203, 189.05; 307/452, 475, 242, 443, 582

[56] References Cited

U.S. PATENT DOCUMENTS

| | | | |
|---|---|---|---|
| 4,433,393 | 2/1984 | Oritani | 365/190 |
| 4,507,759 | 3/1985 | Yasui et al. | 365/189 |
| 4,665,508 | 5/1987 | Chang | 365/190 |
| 4,757,215 | 7/1988 | Seo | 307/452 |
| 4,763,303 | 8/1988 | Flannagan | 365/190 |
| 4,794,567 | 12/1988 | Akatsuka | 365/190 |
| 4,831,590 | 5/1989 | Ichinose | 365/189.05 |
| 4,858,188 | 8/1989 | Kobayashi | 365/190 |

Primary Examiner—Glenn Gossage
Attorney, Agent, or Firm—Robert E. Bushnell

[57] ABSTRACT

An improved data transmission circuit for complementary metal oxide semiconductor (CMOS) dynamic random access memory devices having a data input buffer for converting transistor-transistor logic (TTL) input data signals to CMOS logic level true and complement data signals is described. The data transmission circuit includes a pair of transmission gates for transferring the true and complement data signals in a write cycle, a pair of inverting stages connected between respective ones of the transmission gates and true and complement input/output (I/O) bus lines for inverting data signals from the transmission gates to provide the inverted data signals to true and complement I/O bus lines in the write cycle and an equalizing stage for precharging and equalizing true and complement I/O bus lines in a precharge cycle. The data transmission circuit is characterized in that each of the inverting stages can operate under the control of a block selecting clock signal regardless of the precharging voltages of the true and complement I/O bus lines.

28 Claims, 5 Drawing Sheets

DATA TRANSMISSION CIRCUIT FOR DATA BUSES INCLUDING FEEDBACK CIRCUITRY

BACKGROUND OF THE INVENTION

The present invention relates to a data transmission circuit for use in semiconductor memory devices, and more particularly relates to an improved data transmission circuit for transmitting data signals from a data input buffer to a pair of input/output (herein referred to as "I/O") bus lines in a complementary metal oxide semiconductor (CMOS) dynamic random access memory (hereinafter referred to as a "DRAM") device.

Conventionally, a CMOS DRAM device includes the data input buffer which is activated in a write cycle and converts TTL (Transistor-Transistor Logic) level input data signals to CMOS logic level data signals. The data input buffer supplies true and complement output data signals on a pair of data bus lines, respectively, and signals on the pair of data bus lines are respectively sent to a pair of I/O bus lines. Thereafter, the true and complement data signals on the I/O bus lines are respectively transmitted via a sense amplifier to a pair of corresponding bit lines via a pair of transfer gates; the transfer gates are respectively coupled to the I/O bus lines and turned on by a column address signal. One of the true and complement data signals on the bit line pair is written into one memory cell selected by a row address signal provided by a row address decoder.

However, in high density DRAM device, such as a one mega-bit DRAM, both the data bus line pair and the I/O bus line pair extend a long distance from the data input buffer to the bit line pair. In view of this circuit arrangement, the data input buffer must bear the burden of driving one of the data bus line pairs having parasitic capacitance of approximately 1.5 Pf per line and the corresponding I/O bus line having about 3 Pf to 4 Pf per line as a load.

Figure 1:
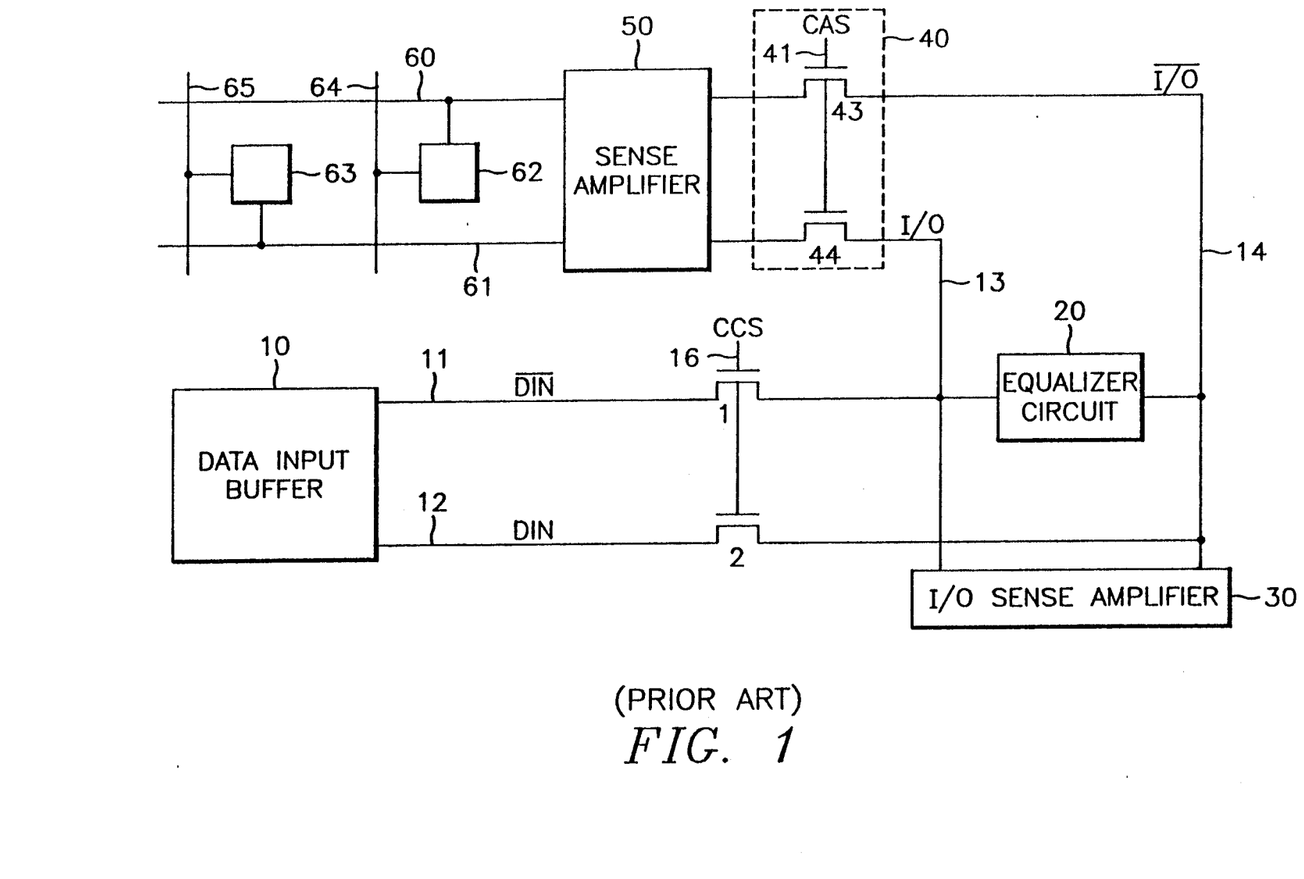
FIG. 1 is a block diagram of a conventional data transmission circuit.

To assist in understanding the disadvantages which plague prior art devices, a data transmission circuit is shown in a block diagram form in FIG. 1. Referring to FIG. 1, the data signal read into the circuit through the data input buffer 10 is output as a pair of true and complement MOS logic level data signals $\overline{DIN}$ and DIN, and the signals $\overline{DIN}$ and DIN are respectively coupled to a pair of data bus lines 11 and 12. The signals $\overline{DIN}$ and DIN are respectively sent on the I/O bus lines 13 and 14 through a pair of transmission transistors 1 and 2 which are turned on by the transfer gate control clock signal CCS on a gate line 16 generated with the combination of a write enable signal and column address signals. The data signals transmitted on the I/O bus lines 13 and 14 are respectively sent on a pair of bit lines 61 and 60 through a pair of transmission transistors 44 and 43 constituting a transfer gate 40 turned on by the column address signal CS on a gate line 41 and through a sense amplifier 50. Thereafter, one of the true and complement data signals on the bit lines 61 or 60 is written into a memory cell 63 or 62 by a row address signal on a row address line 65 or 64.

An I/O sense amplifier 30 operated during only a read cycle amplifies one of the true and complement data signals on the I/O bus lines 13 and 14 read out from the memory cells. An equalizer circuit 20 begins the operation for equalizing the I/O bus lines 13 and 14 at the precharge time of read and write cycles.

Therefore, the data transmission circuit shown in FIG. 1 must drive the large parasitic capacitance of the data bus line and its corresponding I/O bus line as a load in order to write data information into a memory cell 62 or 63.

Therefore, the data input buffer must include a large size current drive transistor at the output stage thereof in order to charge the large parasitic capacitance and as a result, a low rate transfer speed and the large power consumption are effected.

One way of decreasing the parasitic capacitance of the I/O bus line providing the largest capacitance was to divide on chip all memory cells into several blocks including a certain number of memory cells according to the integration and density of memory cells. Such increase of the number of divided blocks causes an increase of I/O bus line pairs and that of their corresponding transmission transistors.

In a write cycle for transferring the data information into the memory cell array, however many are the I/O bus line pairs due to the number of such divided blocks, there is no problem because only one of the I/O bus line pairs is selected and then one of the data signals on the selected I/O bus line pair is stored in an addressed memory cell. However, the larger the integration density of memory cells, the more serious is the problem of testing the memory cells when the memory device is manufactured. That is, the test time for writing data information into all memory cells and for reading the stored information out from each memory cell increases greatly according to the increased density of memory cells. Therefore, to achieve a high speed test of memory cells, a plurality of data bits must be written into addressed memory cells and read out from those memory cells. In this case, since the I/O bus line pairs must be coupled to the data input buffer in the same numbers as the number of data bits written into memory cells, the load burden of the data input buffer will be increased by the number of such data bits. Finally the size of the transistors for driving the I/O bus pairs at the output stage of the data input buffer will be increased to accommodate the increased parasitic capacitance and as a result, the chip size will be increased.

Figure 5:
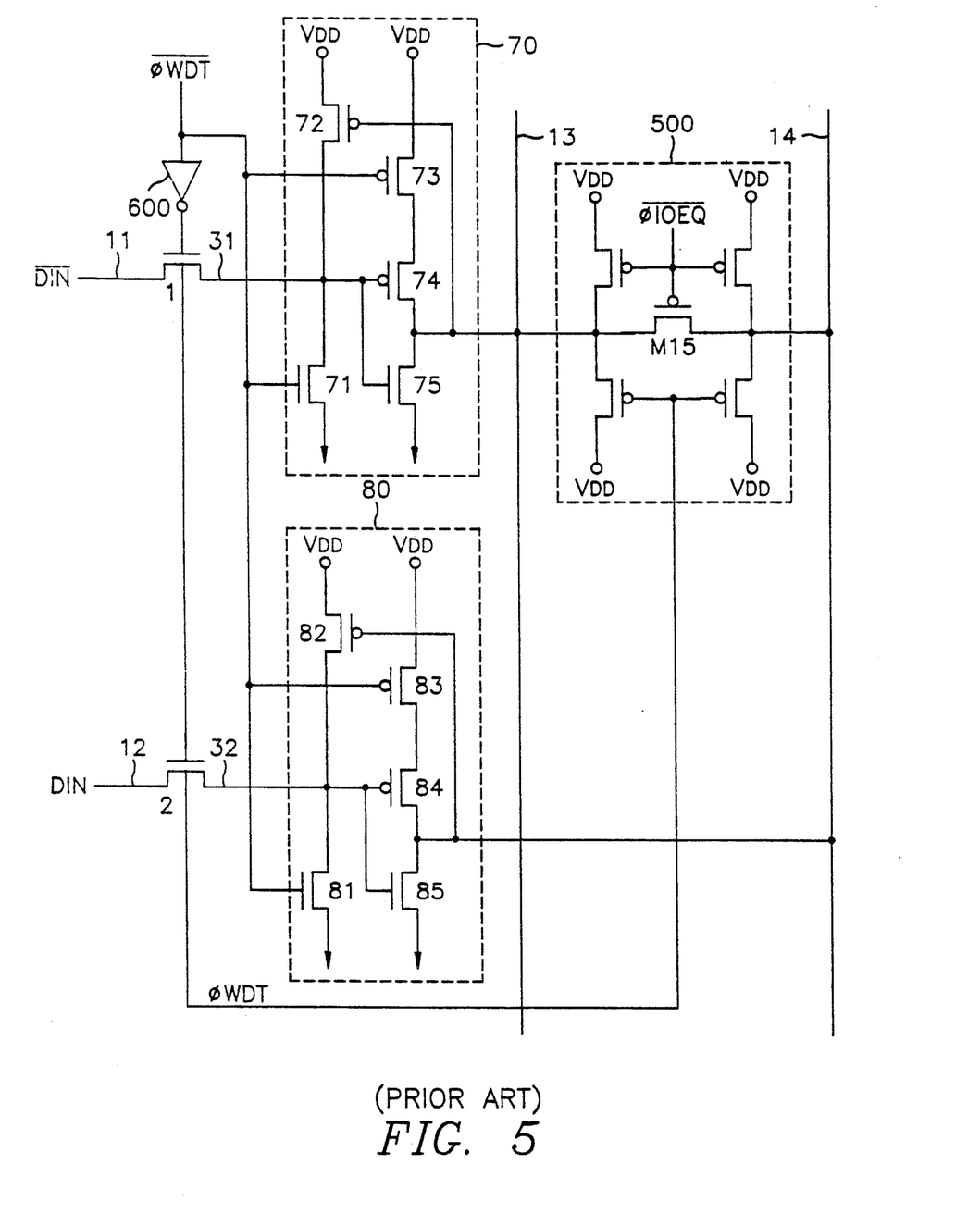
FIG. 5 is a circuit diagram of a conventional data transmission circuit.

The data transmission circuit for solving the predescribed problems, as shown in FIG. 5, is disclosed in an U.S. patent application Ser. No. 067,016 entitled "Data Transmission Circuit", which is now U.S. Pat. No. 4,757,215 allowed to SEO SEUNG-MO and assigned to the present applicant. Referring to FIG. 5, inverting buffer circuits 70 and 80 for isolating data bus lines 11 and 12 and I/O bus lines 13 and 14 are respectively coupled between transmission gates 1 and 2 and data bus lines 13 and 14. In a precharge cycle, all of transmission gates 1 and 2 and inverting buffer circuits 70 and 80 will remain at off-states in response to a write data clock $\overline{\phi WDT}$ applied via inverter 600 to control electrodes of transmission gates 1 and 2, and both of I/O bus lines 13 and 14 will be precharged to a potential VDD through the operation of the precharge and equalizing circuit. In a write cycle, after data $\overline{DIN}$ and DIN from the data input buffer 10 are respectively supplied to data bus lines 11 and 12, in response to the clock $\overline{\phi WDT}$, transmission gates 1 and 2 and inverting buffer circuits 70 and 80 are all operated to transmit inverted data $\overline{DIN}$ and DIN on I/O bus lines 13 and 14 respectively. Therefore, a decreased load burden of the data input buffer will be accomplished because of the treatment of only data bus lines 11 and 12 as loads. This data transmission circuit has no problem in such a precharge scheme that I/O bus lines 13 and 14 are precharged at a full power supply potential VDD. However, where I/O bus lines 13 and 14 are precharged at a half potential, that is, at a potential having an amplitude of ½VDD, the transmission circuit has a drawback in circuit operation. That is, in a precharge cycle, P-channel MOS transistors 72 and 82 are all turned on due to a ½VDD precharge of I/O bus lines 13 and 14. Also, N-channel MOS transistors 71, 81 are turned on in response to the clock $\overline{\phi WDT}$. Therefore, assuming that the transistors 71 and 81 happen to assume less conductive than the transistors 72 and 82, the potential of lines 31 and 32 can be higher than each threshold voltage of N-channel MOS transistors 75 and 85 and consequently, due to the conduction of N-channel MOS transistors 75 and 85, precharge of I/O bus lines 13 and 14 can not be accomplished. Also, the conduction of transistors 71,72,81 and 82 results in wasteful power consumption.

OBJECT OF THE INVENTION

An object of the present invention is to provide an improved data transmission circuit.

It is another object to provide a data transmission circuit that can effect a decreased load burden on a data input buffer in a write cycle.

It is a further object to provide a data transmission circuit which can effect a decreased load burden on a data input buffer in a write cycle and be sure to operate at any precharge potential of I/O bus lines.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE INVENTION

Figure 2:
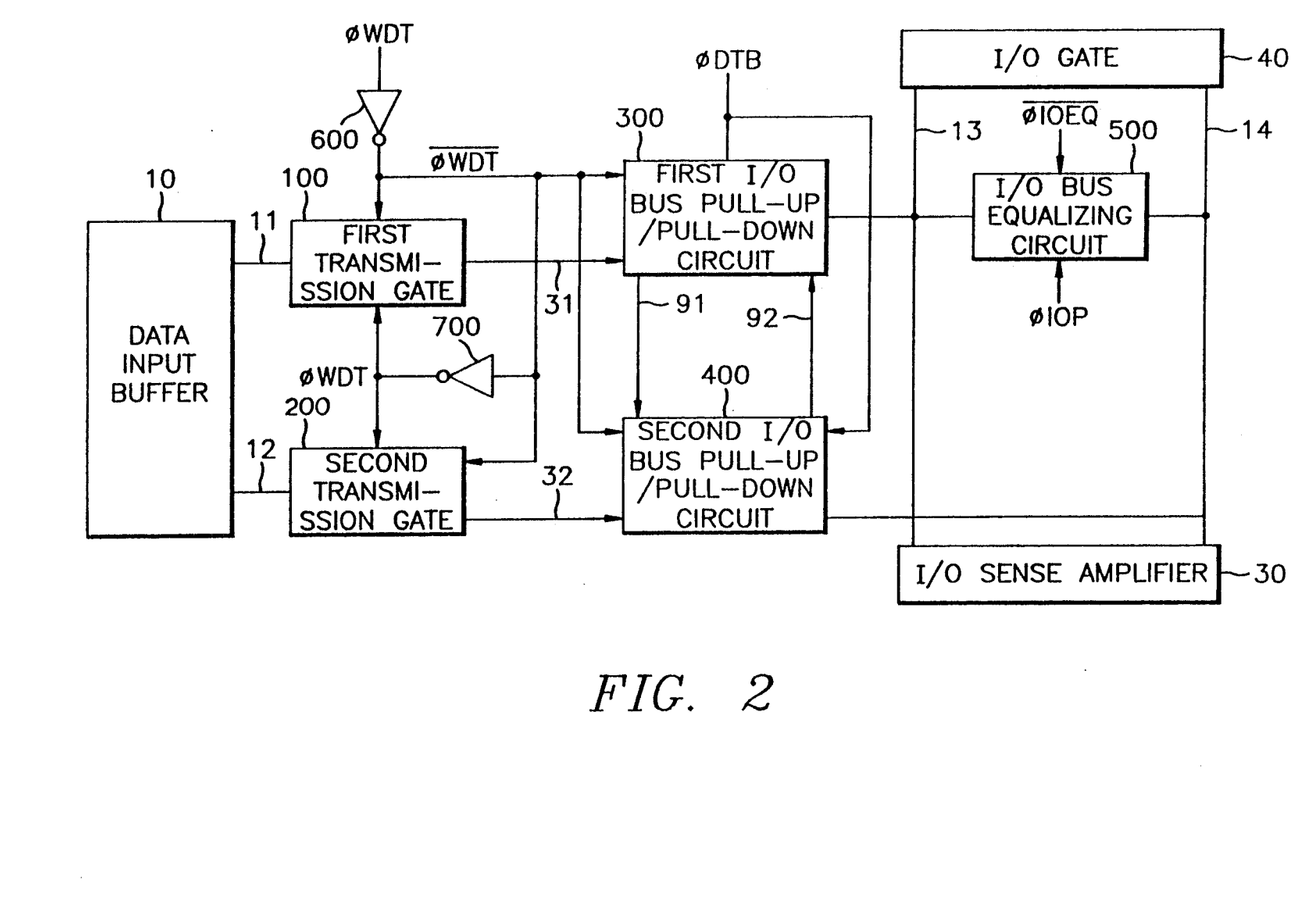
FIG. 2 is a block diagram of a preferred embodiment of the invention.

FIG. 2 is a block diagram of a data transmission circuit according to the present invention. Referring to FIG. 2, the reference numerals of a data input buffer, a pair of data bus lines, a pair of I/O lines, an I/O gate and an I/O sense amplifier are used to designate like elements or parts in both FIG. 2 and in the conventional circuit of FIG. 1.

The present invention of FIG. 2 comprises a first transmission gate(100) which is coupled to the data bus line 11 connected to a complement output line of the data input buffer 10 and is turned on or off under the control of the write data transmission clock $\phi WDT$, and its complement clock signal $\overline{\phi WDT}$ obtained by applying the write data transmission clock signal $\phi WDT$ to an input terminal of inverter 600 for transmitting a data information signal on the data bus line 11 to an output line 31. The complement clock signal $\overline{\phi WDT}$ is applied to an input terminal of inverter 700 to produce clock signal $\phi WDT$ which is then separately applied to first and second transmission gates 100, 200. A second transmission gate (200) is coupled to the other data bus line 12 having the complement signal from the data input buffer in connection with the data signal on the data bus line 11 and is turned on or off under the control of clock signals $\phi WDT$ and $\overline{\phi WDT}$ for transmitting a data information signal on the line 12 to an output line 32. A first I/O bus line pull-up/pull down circuit 300 is coupled between the line 31 and an I/O bus line 13, which, in a write cycle, performs a pull-up or pull-down function on the I/O bus line 13 in response to the data signal on the line 31 under the control of clock signal $\overline{\phi WDT}$ and a block selecting clock signal $\phi DTB$ decoded by the combination of one or more address signals for selecting a write-in block of the data information signal together with a feed-back signal on a line 92, and, in a precharge cycle, isolates between lines 31 and 13 under the control of said clock signals $\overline{\phi WDT}$ and $\phi DTB$. A second I/O bus line pull-up/pull-down circuit 400 is coupled between the line 32 and the other I/O bus line 14, which, in the write cycle, performs a pull-up or pull-down function on the I/O bus line 14 under the control of said clock signals $\overline{\phi WDT}$ and $\phi DTB$ together with a feed back signal on a line 91 and, in a precharge cycle, isolates between lines 32 and 14 under the control of said clock signals $\overline{\phi WDT}$ and $\phi DTB$. An I/O bus line equalizing circuit 500 is coupled between the lines 13 and 14 for precharging and equalizing said lines 13 and 14 in response to an equalizing clock signal $\phi IOEQ$ and an I/O bus line precharging clock signal $\phi IOP$ in the precharge cycle.

The block selecting clock signal $\phi DTB$ and the I/O bus line precharging clock signal $\phi IOP$ will now be described in a detail. For example, in one mega-bit DRAM, the array of its memory cells can be divided into four main blocks, each of which can be again divided into two sub-blocks. Then, the data transmission circuit is coupled to each sub-block. In such case, two main blocks of four main blocks will be selected by one address signal and one sub-block of four sub-blocks in the two main blocks selected by the address signal can be selected by two other address signals. Therefore, the clock signal $\phi DTB$ will be a sub-block selecting signal decoded by those address signals in a write cycle and the generation of such clock signal $\phi DTB$ is well known in the art. On the other hand, the I/O bus line precharging clock signal $\phi IOP$ can be produced by the logic sum of the clock signal $\phi DTB$ and the clock signal $\phi WDT$. The clock $\phi WDT$ can be a conventional write enable signal from an external pin or pad.

In a precharge cycle, prior to the output of data from the data input buffer 10, the first and second I/O bus line pull-up/pull-down circuits 300 and 400 make lines 31 and 32 pull-down to a low state in response to the clock signal $\overline{\phi WDT}$ and at the same time the I/O bus line equalizing circuit 500 causes I/O bus lines 13 and 14 to precharge (or pull-up) at a high state (VDD or ½ VDD) in response to clock signals $\phi IOEQ$ and $\phi IOP$.

Now if the data signals from the data input buffer 10 are supplied on the data bus lines 11 and 12, both first and second transmission gates 100 and 200 are activated by clock signals $\overline{\phi WDT}$ and $\phi WDT$ and then deliver data signals on the data bus lines to lines 31 and 32, respectively. Data signals on the lines 31 and 32 are inverted by the first and second I/O bus line pull-up/pull-down circuits 300 and 400 under the control of clock signals $\overline{\phi WDT}$, $\phi DTB$ and are delivered to lines 13 and 14, respectively. Therefore, with respect to the first I/O bus line's pull-up/pull-down circuit 300, if an inverted signal on the line 91 and the signal on the line 92 each have the same logical values then circuit 300 delivers the same logical value to I/O bus line 13 as is on line 91. And the second I/O bus line pull-up/pull-down circuit 400, if an inverted signal opposite to a signal line 92 and the signal on line 91 each have the same logical values, then circuit 400 delivers the same logical value as that on the line 92 to the I/O bus line 14. As a result, each of the first and second I/O bus lines pull-up/pull-down circuits 300 and 400 works to completely isolate data bus lines 11 and 12 and I/O bus lines 13 and 14 with the control clock signals $\overline{\phi WDT}$ and $\phi DTB$. Subsequent to writing the data signal on the I/O bus line 13 or 14 into the memory array through the I/O gate 40, both I/O bus lines 13 and 14 are precharged to a logic high state under the precharge operation of the I/O bus line equalizing circuit 500 receiving clock signals $\phi IOEQ$ and $\phi IOP$.

Figure 3:
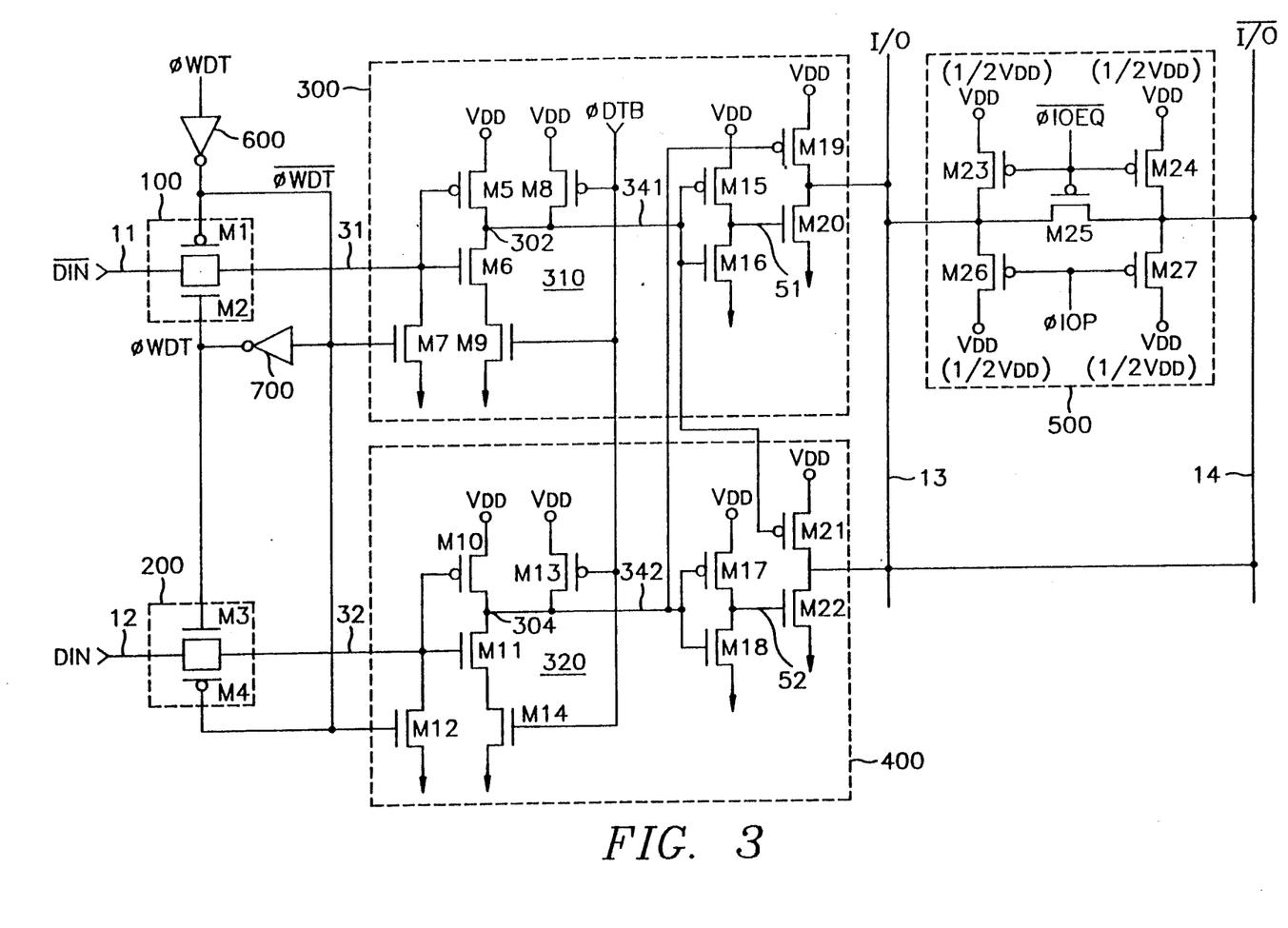
FIG. 3 is a circuit diagram showing a portion of the block diagram of FIG. 2.

Referring to FIG. 3 showing a detailed circuit diagram of a portion of FIG. 2, as well as to FIG. 2 itself, data bus lines 11 and 12 are connected to the output line of the data input buffer 10 and I/O bus lines 13 and 14 are connected to the I/O gate 40 and the I/O sense amplifier 30.

Transistors M2, M3, M6, M7, M9, M11, M12, M14, M16, M18, M20 and M22 are all N-channel MOS transistors and transistors M1, M4, M5, M8, M10, M13, M15, M17, M19, M21 and M23 through M27 are all P-channel MOS transistors. VDD depicts a power supply source voltage and remaining reference numerals are used to designate like elements or parts to those in FIG. 2.

Figure 4:
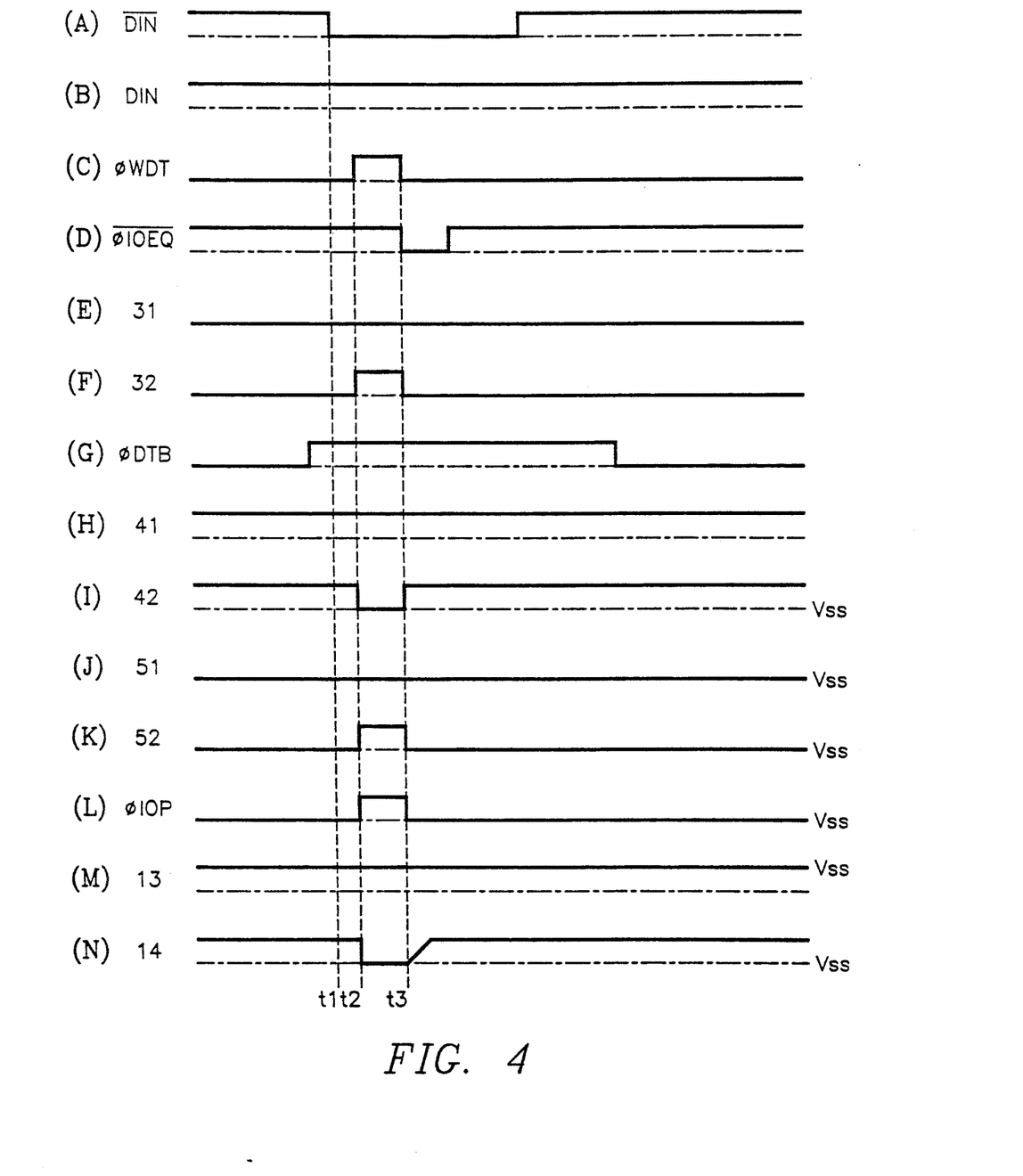
FIG. 4 is a timing diagram illustrative of the operation of the circuit FIG. 3.

Waveforms (A) and (B) of FIG. 4 are respectively waveform diagrams of data signals $\overline{DIN}$ and DIN on data bus lines 11 and 12 provided by the data input buffer 10. Waveforms (C) and (D) represent timing diagrams of the write data transmission clock signal $\phi WDT$ and the I/O bus line equalizing clock signal $\overline{\phi IOEQ}$ respectively. Waveforms (E) and (F) represent output waveforms of first and second transmission gate 100 and 200 respectively. Waveform (G) of FIG. 4 represents a timing diagram of the block selecting clock signal $\phi DTB$. Waveforms (H) and (I) represent waveforms on lines 341 and 342 respectively. Waveforms (J) and (K) represent waveforms on lines 51 and 52 respectively. Waveform (L) represents a timing diagram of the I/O bus line precharging clock signal $\phi IOP$. Finally, waveforms (M) and (N) represent output waveforms of I/O bus lines 13 and 14 respectively.

Hereinafter, the operation of the present invention of FIG. 3 will be described in detail in connection with waveform diagrams of FIG. 4.

Before data signals $\overline{DIN}$ and DIN on data bus lines 11 and 12 are supplied from the data input buffer 10 (prior to the time t1 of FIG. 4), the write data transmission clock $\phi WDT$ is maintained at a logic low state and the I/O bus line equalizing clock signal $\phi IOEQ$ and the I/O bus line precharging clock signal $\phi IOP$ remain at a logic high state and a logic low state respectively. Therefore, pull-down transistors M7 and M12 respectively constituting first and second I/O bus line pull-up/pull-down circuits 300 and 400 are turned on and both lines 31 and 32 become low. Also, pull-up transistors M26 and M27 constituting the I/O bus line equalizing circuit 500 are turned on by the clock signal $\phi IOP$, thereby each of I/O bus lines 13 and 14 is precharged to a logic high state (VDD) or a half VDD level.

Assuming that the true data signal DIN and the complement data signal $\overline{DIN}$ were respectively applied on the data bus lines 11 and 12 as shown in waveforms (A) and (B) following the time T1, and that the clock signal $\overline{\phi WDT}$ became high at the time t2 as illustrated in waveform (C), both the first transmission gate 100 composed of transistors M1 and M2 and the second transmission gate 200 composed of transistors M3 and M4 would be turned on by the inverted clock signal $\phi WDT$ through an inverter 600 and by the inverted clock signal $\phi WDT$ of the clock signal $\overline{\phi WDT}$ through an inverter 700, and then each of the signals on lines 31 and 32 would become low and high as shown in waveforms (E) and (F) due to OFF states of both transistors M7 and M12 gates of which are coupled to the clock signal $\overline{\phi WDT}$. Transistors M5, M6, M8 and M9 constitute one NAND gate 310 and transistors M10, M11, M13 and M14 the other NAND gate 320. The source-drain path of the transistor M5 and the drain-source paths of transistors M6 and M9 are connected in series between the power supply source voltage VDD and the ground potential and the source-drain path of the transistor M8 is connected between the power supply source voltage VDD and the common connection point 302 of each drain of transistors M5 and M6. Transistors M10, M11, M13 and M14 constituting the NAND gate 320 are connected in the same manner as the NAND gate 310. Therefore, the line 341 coupled to the point 302 becomes high (VDD) with the low state on the line 31 which is applied to gates of transistors M5 and M6 and the high state of clock signal $\phi DTB$ which is supplied to gates of transistors M8 and M9, while the line 342 coupled to the point 304 becomes low with the high state on the line 32 which is applied to gates of transistors M10 and M11 and the high state of the clock signal $\phi DTB$ which is supplied to gates of transistors M13 and M14. The high state on the line 341 is coupled to gates of transistors M15 and M16 constituting an inverter, and the output line 51 of the inverter becomes low. Therefore, the transistor M20 whose gate is coupled to the line 51 is turned off and the transistor M19 constituting push-pull circuit together with the transistor M20 whose gate is coupled to the line 92 connected to the line 342 is turned on. Then, the I/O bus line 13 becomes full VDD through the source-drain path of the transistor M19.

On the other hand, the low state on the line 342 is coupled to gates of transistors M17 and M18 constituting the other inverter and the output line 52 thereof becomes high. Therefore, the transistor M22 whose gate is coupled to the line 52 is turned on and the transistor M21 constituting the other push pull circuit together with the transistor M22 whose gate is coupled to the line 91 connected to the line 341 is turned off. Then, the I/O bus line 14 is discharged to the logical low state (the ground level state) through the drain-source path of the transistor M22.

As a result, in a write cycle, I/O bus lines 13 and 14 are respectively sure to remain at a full VDD level and a ground level, or at the reversed levels. These true and complement data signals on I/O bus line 13 and 14 are supplied to the memory array through the I/O gate 40 of FIG. 2.

Thereafter, at time t3, the low state of the I/O bus line equalizing clock signal $\overline{\phi IOEQ}$ turns on transistors M23 through M25 and at the same time the low state of the clock signal $\phi IOP$ turns on transistors M26 and M27. Also, lines 31 and 32 are both at low states due to the high state of the clock signal $\overline{\phi WDT}$ and the both lines 341 and 342 become high states with the low states of lines 31 and 32 through NAND gates 310 and 320. Therefore, transistors M19 through M22 are turned off and both I/O bus lines 13 and 14 are charged to a full VDD or a half VDD. As described above, in a write cycle, since data signals on lines 341 and 342 respectively control not only the transistor M21 through the line 91 and the transistor M19 through the line 92, but also the transistor M20 through the inverter constituted by transistors M15 and M16 and the transistor M22 through the other inverter constituted by transistors M17 and M18, I/O bus lines 13 and 14 can always maintain as inverting relationship each other.

Also, since each of the first and second transmission gates 100 and 200 are composed of a P-channel MOS transistor and an N-channel MOS transistor having good transfer characteristics of high and low states respectively, they have good data transmission characteristics regardless of any states of data bus lines 11 and 12.

As another advantage, a decreased size of the load transistor of the data input buffer will be achieved because the data input buffer treats only the parasitic capacitance of data bus lines as a load in a circuit arrangement of the I/O bus line pull-up/pull-down circuit between the transmission gate and the I/O bus line. Moreover, the size of the transmission gate can be

What is claimed is:

1. A data transmission circuit, comprising:
    transmission means for transmitting true and complement data signals to true and complement data bus lines during a write cycle;
    equalizing means for equalizing precharging voltages on true and complement input/output bus lines during a precharge cycle; and
    inverting means coupled between said true and complement data bus lines and the true and complement input/output bus lines to receive said true and complement data signals, for responding to a first clock signal and a selecting signal by providing inverted true and complement data signals to the true and complement input/output bus lines respectively, during said write cycle independently of amplitudes of precharging voltages equalized by said equalizing means on the true and complement input/output bus lines during said precharge cycle.

2. The circuit of claim 1, wherein said transmission means comprises first and second gating means each including first and second transistors having principal current path electrodes coupled in parallel between a corresponding one of said true and complement data bus lines and one of first and second input data bus lines, and control electrodes coupled to respond to said first clock signal.

3. The circuit of claim 1, wherein said inverting means comprises first and second inverter means each comprising:
    a first stage coupled to receive true and complement data signals from one of said true and complement data bus lines, invert said true and complement data signals from said one of said true and complement data bus lines to provide inverted first signals, and transmit said inverted first signals via a first intermediate bus;
    a second stage coupled to receive said inverted first signals from said first intermediate bus, invert said inverted first signals to provide inverted second signals, and transmit said inverted second signals via a second intermediate bus; and
    a third stage coupled to provide third signals by inverting said inverted second signals, and to transmit said third signals to one of said true and complement input/output bus lines, said second intermediate bus;
    first feedback means coupled between said first intermediate bus of said first inverter means and said third stage of said second inverter means; and
    second feedback means coupled between said first intermediate bus of said second inverter means and said third stage of said first inverter means.

4. The circuit of claim 1, wherein said inverting means comprises first and second inverter means each including:
    a first stage having first and second transistors with control electrodes coupled to one of said true and complement data bus lines, serially coupled principal current path electrodes connectable between a voltage source and a reference potential, and a first node between said serially coupled principal current path electrodes of said first and second transistors;
    a second stage having third and fourth transistors with control electrodes coupled to said first node, serially coupled principal current path electrodes connectable between said voltage source and said reference potential, and a second node between said serially coupled principal current path electrodes of said third and fourth transistors;
    a third stage having fifth and sixth transistors with serially coupled principal current path electrodes connected between said voltage source and said reference potential, a control electrode of said sixth transistor to said second node, and a third node between said serially coupled principal current path electrodes of said fifth and sixth transistors, said third node being connected to a corresponding one of said first and second input/output bus lines;
    a control electrode of said fifth transistor of said first inverter means being connected to said first node of said second inverter means; and
    a control electrode of said fifth transistor of said second inverter means being connected to said first node of said first inverter means.

5. The circuit of claim 4, wherein said transmission means comprises first and second gating means each comprising seventh and eighth transistors having principal current path electrodes coupled in parallel between one of said true and complement data bus lines and a corresponding one of first and second input data buses, and control electrodes coupled to respond to said first clock signal.

6. A data transmission circuit, comprising:
    transmission means for transmitting true and complement data signals to true and complement data bus lines during a write cycle;
    means for equalizing precharging voltages on true and complement input/output bus lines during a precharge cycle; and
    inverting means coupled between said true and complement data bus lines and the true and complement input/output bus lines, for responding to a first clock signal and a selecting signal independently of amplitudes of said precharging voltages equalized by said equalizing means on the true and complement input/output bus lines, to receive said true and complement data signals and to provide inverted true and complement data signals to the true and complement input/output bus lines during said write cycle.

7. The circuit of claim 6, wherein said transmission means comprises first and second gating means each comprising first and second transistors having principal current path electrodes coupled in parallel between a corresponding one of said true and complement data bus lines and a corresponding one of first and second input data bus lines, and control electrodes coupled to respond to said first clock signal.

8. The circuit of claim 6, wherein said inverting means comprises first and second inverter means each comprising:
   a fist stage coupled to output first signals via a first intermediate bus, said first signals corresponding to inverted ones of said input signals from corresponding ones of said true and complement data bus lines;
   a second stage coupled to output second signals via a second intermediate bus, in dependence upon said first signals from said first intermediate bus; and
   a third stage coupled to said second intermediate bus to output third signals, by inverting said second signals, to said true and complement input/output bus lines;
   first feedback means coupled between said first intermediate bus of said first inverter means and said third stage of said second inverter means; and
   second feedback means coupled between said first intermediate bus of said second inverter means and said third stage of said first inverter means.

9. The circuit of claim 6, wherein said inverting means comprises first and second inverter means each comprising:
   a first stage having first and second transistors with control electrodes coupled to one of said true and complement data bus lines, serially coupled principal current path electrodes connectable between a voltage source and a reference potential, and a first node located between said serially coupled principal current path electrodes of said first and second transistors;
   a second stage having third and fourth transistors with control electrodes coupled to said first node, serially coupled principal current path electrodes connectable between said voltage source and said reference potential, and a second node located between said serially coupled principal current path electrodes of said third and fourth transistors;
   a third stage having fifth and sixth transistors with serially coupled principal current path electrodes connected between said voltage source and said reference potential, a control electrode of said sixth transistor connected to said second node, and a third node between said serially coupled principal current path electrodes of said fifth and sixth transistors, said third node being connected to a corresponding one of said true and complement input/output bus lines;
   a control electrode of said fifth transistor of said first inverter means being connected to said first node of said second inverter means; and
   a control electrode of said fifth transistor of said second inverter means being connected to said first node of said first inverter means.

10. The circuit of claim 9, wherein said transmission means comprises seventh and eighth gating means each comprising first and second transistors having electrodes coupled in parallel between one of said true and complement data bus lines and a corresponding one of first and second input data bus lines, and control electrodes coupled to respond to said first clock signal.

11. An integrated CMOS data transmission circuit, comprising:
   true and complement data buses for receiving input data signals from respective one of true and complement output terminals of a data input buffer;
   first and second transmission gating means for respectively transferring the data signals on said true and complement data buses to first and second lines in response to a first clock signal during a write cycle;
   first and second input/output bus line pull-up/pull-down means respectively connected between said first line and a true input/output bus line, and between said second line and a complement input/output bus line, for pulling a selected one of said true and complement input/output bus lines up and pulling the other of said true and complement input/output bus lines down during said write cycle; and
   equalizing means connected between the true and complement input/output bus lines for precharging and equalizing both of the true and complement input/output bus lines to power supply voltages in response to second and third clock signals during a precharge cycle;
   said first pull-up/pull-down means including first input logic means connected to said first line for inverting data signals on said first line in response to a fourth clock signal to provide first inverted data signals to a third line, second input logic means for inverting data signals on said third line to provide second inverted data signals, and first clocked logic means connected between said second input logic and said true input output bus line for inverting logic data signals from said second input logic means in response to data signals on a fourth line to provide third inverted data signals; and
   said second pull-up/pull-down means including third input logic means connected to said second line for inverting data signals on said second line in response to said fourth clock signal to provide fourth inverted data signals to said fourth line, fourth input logic means for inverting said data signals on said fourth line to provide fifth inverted data signals, and second clocked logic means connected between said fourth input logic means and said complement input/output bus line for inverting data signals from said fourth input logic means in response to data signals on said third line.

12. An integrated CMOS data transmission circuit as claimed in claim 11, characterized in that each first and second pull-up/pull-down means further comprises a pull-down transistor having a gate coupled to receive said first clock signal and a drain-source path connected between a respective one of said first and second lines and a reference potential.

13. An integrated CMOS data transmission circuit as claimed in claim 11, characterized in that each of said first and third input logic means comprises a two-input CMOS NAND gate receiving signals from a respective one of said first and second lines and said fourth clock signal.

14. An integrated CMOS data transmission circuit as claimed in claim 13, characterized in that said fourth clock signal is an address decoding signal for selecting a memory cell array block and said first clock signal is a write enable signal.

15. An integrated CMOS data transmission circuit as claimed in claim 13, characterized in that each of said first and second transmission gating means comprises a P-channel MOS transistor having a gate coupled to receive said first clock signal and a source-drain path connected between a respective one of said data buses and a corresponding one of said first and second lines, and an associated N-channel MOS transistor having a gate coupled to receive the inverse of said first clock signal and a drain-source path connected in parallel with a source-drain path of an associated P-channel MOS transistor.

16. An integrated CMOS data transmission circuit as claimed in claim 11, wherein each of said first and second input logic means for inverting comprises a first stage having first and second transistors with control electrodes coupled to said first line, serially connected principal current path electrodes connectable between a voltage source and reference potential, and a first node located between said serially connected current path electrodes of said first and second transistors.

17. An integrated CMOS data transmission circuit as claimed in claim 16, wherein each of said second and fourth input logic means for inverting comprises a second stage having third and fourth transistors with control electrodes connected to said first node, serially connected principal current path electrodes connectable between said voltage source and said reference potential, and a second node located between said serially connected principal current path electrodes of said third and fourth transistors.

18. An integrated CMOS data transmission circuit as claimed in claim 17, wherein each of said first and second clocked logic means comprises:
  a third stage having fifth and sixth transistors with serially coupled principal current path electrodes connectable between said voltage source and said reference potential, a control electrode of said sixth transistor connected to said second node, and a third node located between said serially coupled principal current path electrodes of said fifth and sixth transistors, said third node being connected to an associated one of said true and complement input/output lines;
  a control electrode of said fifth transistor of said first clocked logic means being connected via said fourth line to said first node of said third input logic means; and
  a control electrode of said fifth transistor of said second clocked logic means being connected via said third line to said first node of said first input logic means.

19. An integrated data transmission circuit, comprising:
  first transmission gating means for transferring input data signals from a true data bus to a first data bus in response to a first clock signal;
  second transmission gating means for transferring input data signals from a complementary data bus to a second data bus in response to said first clock signal;
  first and second circuit means each having a plurality of cascaded stages, and first and second feedback means for interconnecting and transmitting first and second feedback signals between said first and second circuit means, said first circuit means coupling said first transmission gating means to a third data bus and said second circuit means coupling said second transmission gating means to a fourth data bus;
  said first circuit means for delivering output data signals to the third data bus in response to a second clock signal;
  said second circuit means for delivering output data signals to the fourth data bus in response to said second clock signal; and
  equalizing means coupled between the third and fourth data buses for equalizing both of the third and fourth data buses to the same logic level in response to reception of third and fourth clock signals.

20. The circuit of claim 19, wherein said first and second circuit means are connected to respond to said second clock signal by respectively changing logical states of said first and second data buses to a first logical state while said equalizing means precharges the third and fourth data buses during a first cycle.

21. The circuit of claim 19, wherein said first and second transmission gating means each comprises:
  first and second transistors having principal current path electrodes coupled in parallel between a corresponding one of said true and complement data buses and a corresponding one of said first and second data buses, and control electrodes coupled to respond to said first clock signal.

22. The circuit of claim 19, wherein said first and second circuit means each comprises:
  a first stage coupled to receive input signals from a corresponding one of said first and second data buses, and to transmit first signals via a first intermediate bus in dependence upon input signals received, and in response to said second clock signal;
  a second stage coupled to receive said first signals, and to transmit second signals via a second intermediate bus in dependence upon said first signals; and
  a third stage coupled to respond to one of said first and second feedback signals be inverting said second signals to provide said output data signals to a corresponding one of said third and fourth data buses.

23. The circuit of claim 19, wherein said first and second circuit means each comprises:
  a first stage having first and second transistors with control electrodes coupled to a corresponding one of said first and second data buses, serially coupled principal current path electrodes connected between a voltage source and a reference potential, and a first node located between said serially coupled principal current path electrodes of said first and second transistors;
  a second stage having third and fourth transistors with control electrodes coupled to said first node, serially coupled principal current path electrodes connected between said voltage source and said reference potential, and a second node located between said serially coupled principal current path electrodes of said third and fourth transistors;
  a third stage having fifth and sixth transistors with serially coupled principal current path electrodes connected between said voltage source and said reference potential, with a control electrode of said sixth transistor connected to said second node, and with a third node located between said serially coupled principal current path electrodes of said fifth and sixth transistors, said third node being connected to an associated one of said third and fourth buses;

a control electrode of said fifth transistor of said first circuit means being connected via said second feedback means to said first node of said circuit means; and a control electrode of said fifth transistor of said second circuit means being connected via said first feedback means to said first node of said first circuit means.

24. A integrated data transmission circuit, comprising:

true and complement data buses;

first transmission gating means for transferring input data signals from said true data bus to a first data bus;

second transmission gating means for transferring input data signals from said complement data bus to a second data bus;

first and second circuit means, said first circuit means coupling said first gating means to a third bus and said second circuit means coupling said second gating means to a fourth bus;

first and second feedback means for respectively interconnecting and transmitting first feedback signals and second feedback signals between said first and second circuit means;

said first circuit means for delivering to said third bus output signals having the same logical state as said first feedback signals whenever said first feedback signals and second feedback signals both exhibit the same logical values; and said second circuit means for delivering to said fourth bus output signals having the same logical state as said second feedback signals whenever said first feedback signals and second feedback signals both exhibit the same logical values.

25. The circuit of claim 24, further comprising:

equalizing means coupled between the third and fourth buses for equalizing both of said third and fourth buses to the same logic level in response to reception of first and second clock signals; and said first and second circuit means being coupled to respond to a third clock signal by respectively changing logical states of said first and second data buses to a first logical state while said equalizing means precharge the third and fourth buses during a first cycle.

26. The circuit of claim 24, wherein said first and second transmission gating means each comprises:

first and second transistors having principal current path electrodes coupled in parallel between a corresponding one of said true and complement data buses and a corresponding one of said first and second data buses, and control electrodes coupled to respond to a first clock signal.

27. The circuit of claim 24, wherein said first and second circuit means each comprises:

a first stage coupled to output first intermediate signals at a first intermediate bus, by inverting said input data signals from an associated one of said first and second data buses;

a second stage coupled to output second intermediate signals at a second intermediate bus, by inverting said first intermediate signals; and a third stage coupled to output data signals to said third bus, by inverting said second intermediate signals from said second intermediate bus;

said first feedback means being coupled between said second intermediate bus of said first circuit means and said third stage of said second circuit means; and said second feedback means being coupled between said second intermediate bus of said second circuit means and said third stage of said first circuit means.

28. The circuit of claim 24, wherein said first and second circuit means each comprises:

a first stage having first and second transistors with control electrodes coupled to a corresponding one of said first and second data buses, serially coupled principal current path electrodes connected between a voltage source and a reference potential, and a first node between said serially coupled principal current path electrodes of said first and second transistors;

a second stage having third and fourth transistors with control electrodes coupled to said first node, serially coupled principal current path electrodes connected between said voltage source and said reference potential, and a second node between said serially coupled principal current path electrodes of said third and fourth transistors;

a third stage having fifth and sixth transistors with serially coupled principal current path electrodes connected between said voltage source and said reference potential, a control electrode of said sixth transistor connected to said second node, and a third node between said serially coupled principal current path electrodes of said fifth and sixth transistors, said third node being connected to a corresponding one of said third and fourth buses;

a control electrode of said fifth transistor of said first circuit means being connected via said feedback means to said first node of said second circuit means; and a control electrode of said fifth transistor of said second circuit means being connected via said first feedback means to said first node of said first circuit means.

* * * * *